United States Patent
Maruyama et al.

(10) Patent No.: US 6,323,440 B1
(45) Date of Patent: Nov. 27, 2001

(54) PART HOLDER, SUBSTRATE HAVING SAME, AND METHOD OF MANUFACTURING SAME

(75) Inventors: Yoshio Maruyama, Kyoto; Takahiro Matsuo; Osamu Hikita, both of Hirakata; Shinji Kadoriku, Takarazuka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/627,891

(22) Filed: Jul. 28, 2000

Related U.S. Application Data (6262) Division of application No. 08/981,344, filed as application No. PCT/JP96/01681 on Jun. 19, 1996.

(30) Foreign Application Priority Data

Jun. 20, 1995 (JP) .................................................. 7-153079

(51) Int. Cl.[7] .................................................. H01R 9/22
(52) U.S. Cl. .................... 174/262; 174/260; 174/261; 301/751; 301/760
(58) Field of Search .................. 174/262, 261, 174/260; 361/748, 749, 751, 760, 721

(56) References Cited

U.S. PATENT DOCUMENTS 4,725,920 * 2/1988 Ijichi et al. ........................... 361/721
5,858,100 * 1/1999 Maeda et al. ........................ 118/728
5,870,289 * 2/1999 Tokuda et al. ...................... 174/262

FOREIGN PATENT DOCUMENTS

| | | |
|---|---|---|
| 54-94856 | 7/1979 | (JP) . |
| 58-142958 | 9/1983 | (JP) . |
| 59-160955 | 11/1984 | (JP) . |
| 61-27271 | 2/1986 | (JP) . |
| 64-54359 | 4/1989 | (JP) . |
| 5-13892 | 1/1993 | (JP) . |

OTHER PUBLICATIONS

Japanese language search report for Int'l Appln No. PCT/JP96/01681 dated Sep. 24, 1996.

English translation of Japanese language search report for Int'l Appln. No. PCT/JP96/01681 dated Sep. 24, 1996.

* cited by examiner

*Primary Examiner*—Albert W. Paladini
(74) *Attorney, Agent, or Firm*—Ratner & Prestia, P.C.

(57) ABSTRACT

A part holder comprising holding members (8, 9) extending upward on a base (10) to hold a part (11), insertion holes (12) penetrating the base (10) and passing lead wires (12) of the part (11) through when the part (11) is held by the holding members, and supports (17) extending downward on the base (10) and adapted to be supported on a substrate (15), on which a predetermined electric circuit is formed.

20 Claims, 20 Drawing Sheets

Fig. 1 9 (a)
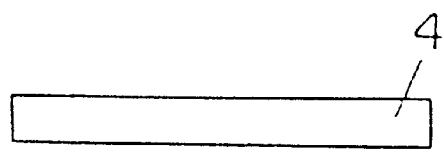
Fig. 1 9 (b)
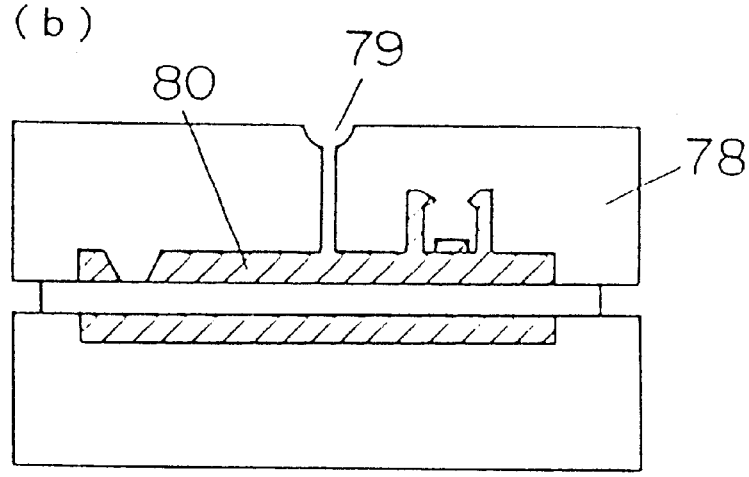
Fig. 1 9 (c)
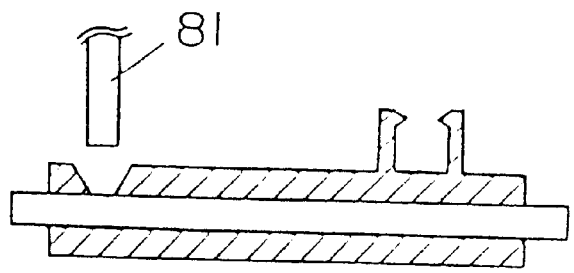

PART HOLDER, SUBSTRATE HAVING SAME, AND METHOD OF MANUFACTURING SAME

THIS APPLICATION IS A DIVISIONAL APPLICATION OF U.S. APPLICATION Ser. No. 08/981,344 filed Dec. 19, 1997, which is a 371 of PCT/JP96/01681 filed Jun. 19, 1996.

TECHNICAL FIELD

The present invention relates to a part holder for holding a part to be provided in a circuit board for composing an electric circuit of an electric appliance, and a substrate having such part holder.

BACKGROUND ART

Hitherto, printed circuit boards have been widely used in the field of electric appliances. In printed circuit boards, holes for inserting leads of electronic parts with leads are small in diameter in order that solder may not come out to the upper side through insertion holes when soldering by flow method. Therefore, when inserting an electronic part with leads, for the ease of insertion of leads, it has been widely known to fix a separately fabricated insertion guide preliminarily to the printed circuit board.

The insertion guide of a prior art is described below by referring to FIG. 20 and FIG. 21. An insertion guide 101 has fixing protrusions 102 near the central part, and these fixing protrusions 102 are fitted into positioning holes 104 provided in a printed circuit board 103, and it is mounted on the printed circuit board 103. When the insertion guide 101 is thus mounted on the printed circuit board 103, conical guide holes 107 for guiding leads 106 of an electronic part 105 provided at both ends of the insertion guide 101, and penetration holes 108 of small inside diameter are positioned so as to be coaxial with insertion holes 109 of the printed circuit board 103. In this state, when the leads 106 are inserted into conical guide holes 107, the leads 106 can be easily inserted along the conical portion of the guide holes 107.

In the constitution of the prior art, first, regarding the insertion guide, unless the electronic part with leads is fixed provisionally by clinching the lead wires, the electronic part with leads may drop off while conveying the printed circuit board. Next, regarding the printed circuit board, unless the part is fixed provisionally by using adhesive or clinching the leads, the part may drop off while conveying the printed circuit board.

DISCLOSURE OF THE INVENTION

In the light of the conventional problems, it is hence an object of the invention to present a part holder not requiring any process for fixing provisionally the part, a substrate having such part holder, and a method of manufacturing it.

BRIEF DESCRIPTION OF THE DRAWINGS

FIG. 1(*b*) is a sectional view of 1(*b*)—1(*b*) in FIG. 1(*a*).

FIG. 2(*b*) is a drawing showing a state of inserting conductors into a substrate having a part holder in an embodiment of the invention.

FIG. 2(*c*) is a drawing showing a state of inserting conductors into a substrate having a part holder in an embodiment of the invention.

FIG. 3(*b*) is a sectional view of 3(*b*)—3(*b*) in FIG. 3(*a*).

FIG. 3(*c*) is a drawing showing a part mounted on a part holder in an embodiment of the invention.

FIG. 4(*b*) is a sectional view of 4(*b*)—4(*b*) in FIG. 4(*a*).

FIG. 5(*b*) is a sectional view of 5(*b*)—5(*b*) in FIG. 5(*a*).

FIG. 5(*c*) is a sectional view of 5(*c*)—5(*c*) in FIG. 5(*a*).

FIG. 5(*d*) is a sectional view of 5(*d*)—5(*d*) in FIG. 5(*a*).

FIG. 6(*b*) is a sectional view of 6(*b*)—6(*b*) in FIG. 6(*a*).

FIG. 6(*c*) is a sectional view of 6(*c*)—6(*c*) in FIG. 6(*a*).

FIG. 7(*b*) is a drawing showing a state of mounting a part holder on a substrate capable of mounting a part holder in an embodiment of the invention.

FIG. 8(*b*) is a drawing showing a substrate capable of mounting a part holder in an embodiment of the invention.

FIG. 9(*b*) is a sectional view of 9(*b*)—9(*b*) in FIG. 9(*a*).

FIG. 9(*c*) is a drawing showing a state of mounting a part in a sectional view of 9(*c*)—9(*c*) in FIG. 9(*a*).

FIG. 10(*b*) is a sectional view of 10(*b*)—10(*b*) in FIG. 10(*a*).

FIG. 10(*c*) is a sectional view of 10(*c*)—10(*c*) when mounting a chip part in FIG. 10(*a*).

FIG. 10(*d*) is other sectional view of 10(*d*)—10(*d*) in FIG. 10(*a*).

FIG. 11(*b*) is a sectional view of 11(*b*)—11(*b*) in FIG. 10(*a*).

FIG. 11(*c*) is other sectional view of 11(*c*)—11(*c*) in FIG. 11(*a*).

FIG. 11(*d*) is a sectional view of 11(*d*)—11(*d*) when mounting a chip part in FIG. 11(*a*).

FIG. 19(a), FIG. 19(b), and FIG. 19(c) are drawings showing a method of manufacturing a substrate having a part holder in an embodiment of the invention.

DETAILED DESCRIPTION OF THE INVENTION

Figure 1:
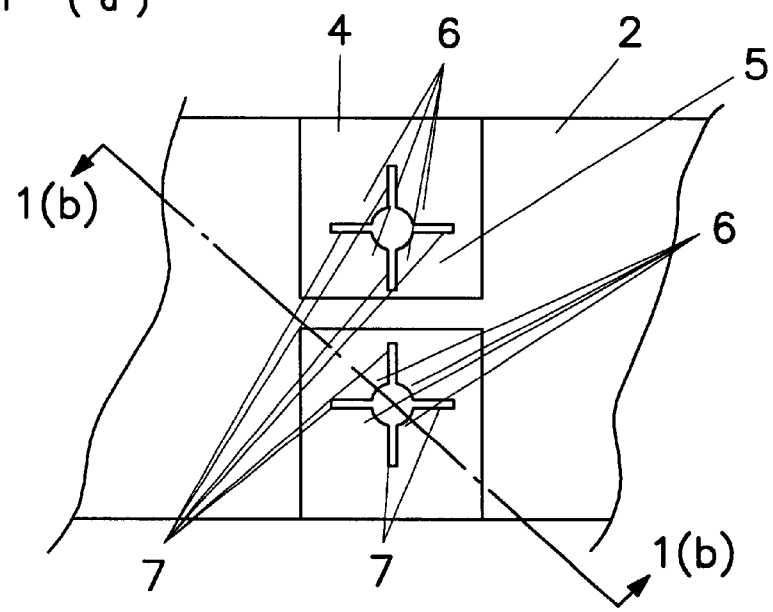
FIG. 1(*a*) is a plan view of a substrate having a part holder in an embodiment of the invention.
Figure 1:
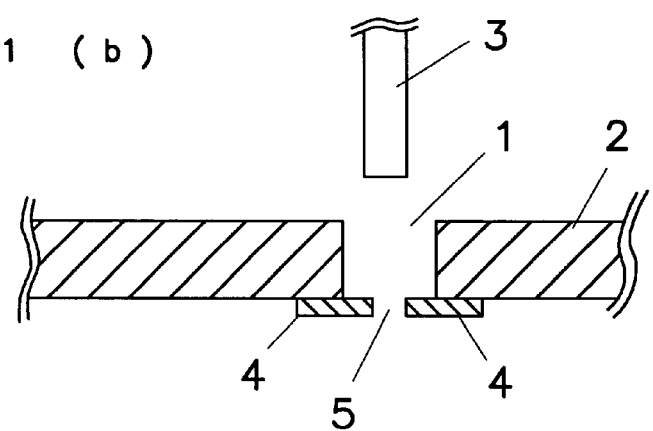

Referring now to the drawings, a part holder of the invention, a substrate having the part holder, and an apparatus using the same are described specifically below.

(Embodiment 1)

FIG. 1(a) and FIG. 1(b) are drawings showing a substrate having a part holder in an embodiment of the invention. A first insertion hole 1 penetrates through a substrate 2, and it is intended to insert a lead wire 3 which is a conductor provided in an electronic part, such as transistor and capacitor. A copper plate 4 which is a conductor is formed on the substrate 2, and a second insertion hole 5 penetrates through the copper plate 4, in which the lead wire 3 can be inserted. Lead holding portions 6 are provided around the second insertion hole 5, and it is configured so that the lead holding portions 6 can hold the lead wire 3 when the lead wire 3 penetrates through the first insertion hole 1 and second insertion hole 5.

Specifically, the first insertion hole 1 penetrates through the substrate 2, and its diameter is not less than the width of the lead wire 3. The copper plate 4 is formed on the substrate 2, the second insertion hole 5 penetrates through the copper plate 4, and its diameter is not more than the width of the lead wire 3. Notches 7 are provided in four lines elongated radially from the center of the insertion hole 5, in a cross form around the second insertion hole 5. In such configuration, when the lead wire 3 is inserted into the first insertion hole 1 and second insertion hole 5, the lead holding portions 6 around the second insertion hole 5 flexes or bends in the insertion direction of the lead wire 3. At this time, the lead holding portions 6 of copper plate 4 are inclined to restore by its elasticity. Therefore, the lead holding portions 6 press the lead wire 3 from four direction in its central axial direction, and the lead wire 3 is held, so that the part having the lead wire 3 can be held.

In such embodiment, the action for inserting the lead wire 3 into the first insertion hole 1 and second insertion hole 5 is explained below by referring to FIG. 2(a), FIG. 2(b), and FIG. 2(c).

Figure 2:
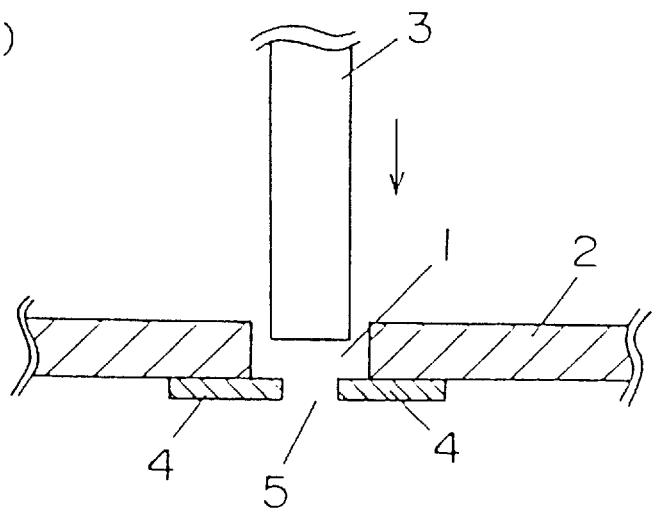
FIG. 2(*a*) is a drawing showing a state of inserting conductors into a substrate having a part holder in an embodiment of the invention.
Figure 2:
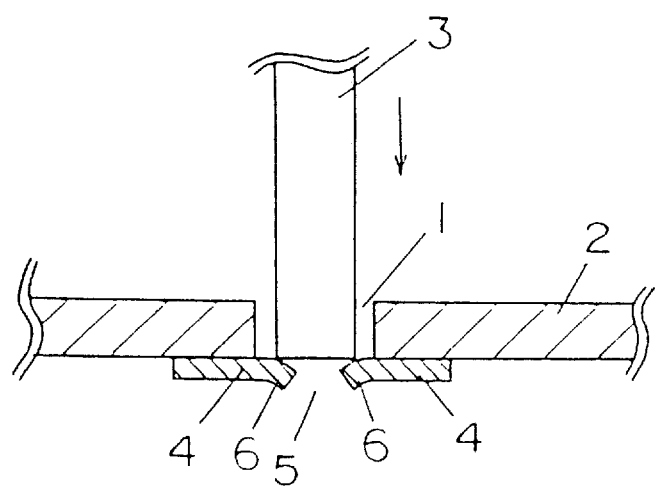
Figure 2:
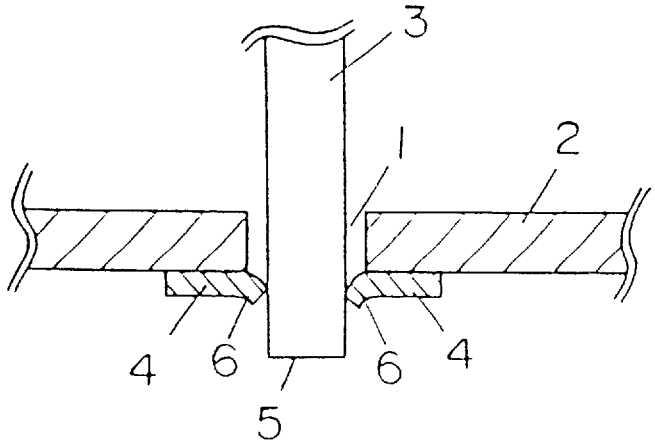

FIG. 2(a) is a drawing showing a state of inserting the lead wire 3 into the first insertion hole 1, and from this state the lead wire 3 is inserted into the arrow direction.

FIG. 2(b) is a drawing showing a state of inserting the lead wire 3 into the first insertion hole 1 to contact with the copper plate 4, in which the lead wire 3 bulges the lead holding portions 6 around the second insertion hole 5 in the insertion direction of the lead wire 3.

FIG. 2(c) is a drawing showing a state of penetrating the lead wire 3 through the first insertion hole 1 and second insertion hole 5, in which the lead wire 3 bulges the lead holding portions 6 in the insertion direction of the lead wire 3 further from the state shown in FIG. 2(b). At this time, the lead holding portions 6 of copper plate 4 is inclined to restore by its elasticity. Therefore, the lead holding portions 6 around the second insertion hole 5 press the lead wire 3 from four direction in its central axial direction, and the lead holding portions 6 can hold the lead wire 3.

In such embodiment, the part can be held on the substrate by holding the lead wire 3 on the lead holding portions 6, thereby preventing the trouble of dislocation of lead wire 3 from the substrate while conveying the substrate and occurrence of faulty contact in the subsequent soldering process.

It is not necessary to fix the part provisionally by using adhesive or clinching the lead wire 3, or fit the insertion guide.

In the embodiment, four notches 7 are provided radially from the center of the second insertion hole 5, in a cross form, but the shape is not particularly limited as far as the lead wire 3 can be held.

(Embodiment 2)

Figure 3:
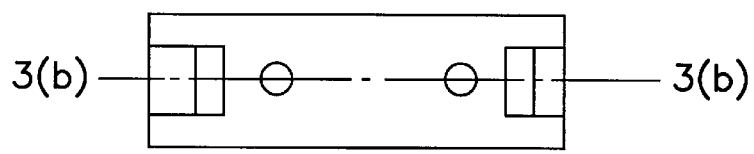
FIG. 3(*a*) is a drawing showing a part holder in an embodiment of the invention.
Figure 3:
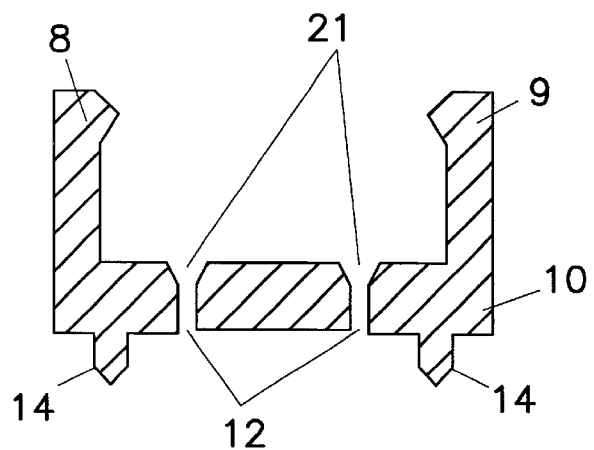
Figure 3:
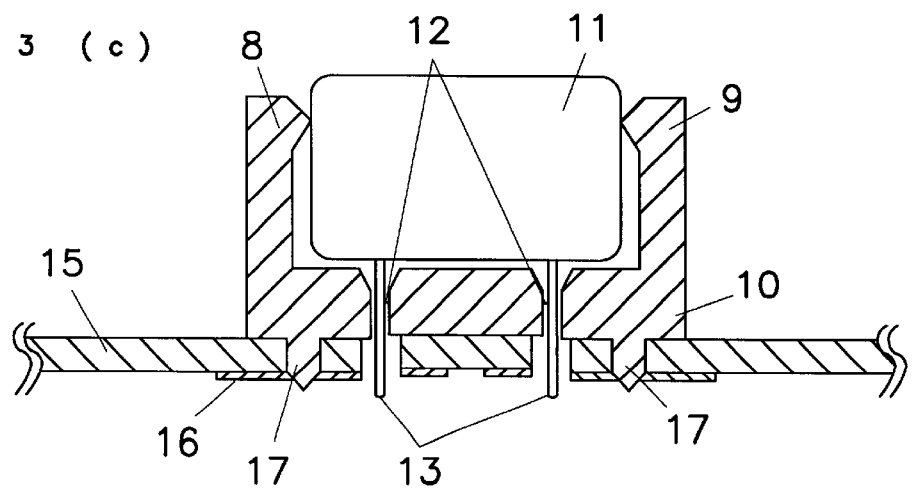

FIG. 3(a), FIG. 3(b), and FIG. 3(c) are drawings showing a part holder in an embodiment of the invention. First holding member 8 and second holding member 9 are provided upward on a base 10, and, as shown in FIG. 3(c), when a part 11 such as capacitor or resistor is inserted, the first holding member 8 and second holding member 9 pinch the part 11 by the elasticity of resin which is an insulating plate. An insertion hole 12 penetrates through the base 10, and when the part 11 is held between the first holding member 8 and second holding member 9, the lead wire 13 which is a conductor provided beneath the part 11 is inserted into this insertion hole 12. On one side of an insulating plate 15, a predetermined electric circuit is formed by a copper plate 16, and a fitting hole 17 penetrates through the insulating plate 15. By fitting a support 14 into a fitting hole 17 from the other side of the insulating plate 15, the part holder is fixed and supported on the insulating plate 15. In the insertion hole 12, for the ease of insertion of the lead wire 13 into the insertion hole 12, there is a conical lead guide 21 having a slope for guiding the lead wire 13 into the insertion hole 12, with its peak directed to the lower side, provided coaxially with the central axis of the insertion hole 12. That is, the lead guide 21 has a slope for guiding and inserting the lead wire 13 provided in the part 11 into the insertion hole 12, and it is provided at the side of mounting the part 11 in the insertion hole 12 and coaxially with the insertion hole 12. The diameter of the insertion hole 12 is such that the solder may not come out to the upper side (part side) through the insertion hole 12 when soldering by flow method in subsequent process. In the embodiment, the lead wire 13 is 0.6 mm in diameter, and the insertion hole 12 is 1.0 mm in diameter, and the clearance (the gap between the insertion hole 12 and lead wire 13) is 0.2 mm.

Figure 4:
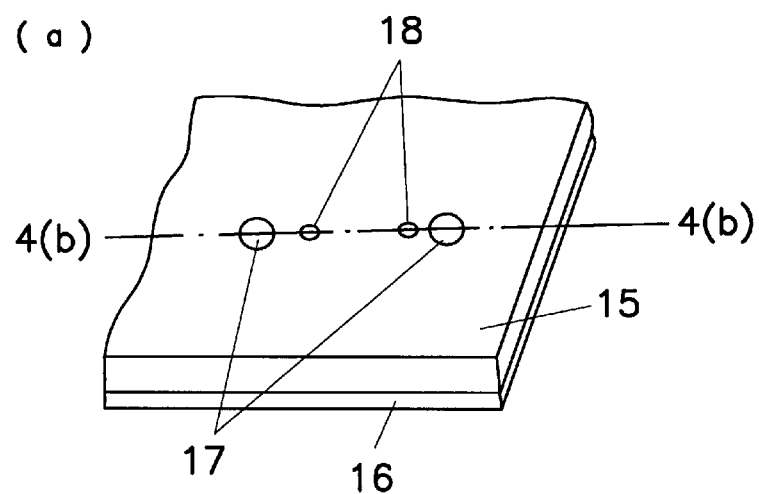
FIG. 4(*a*) is a drawing showing a substrate for mounting a part holder in an embodiment of the invention.
Figure 4:
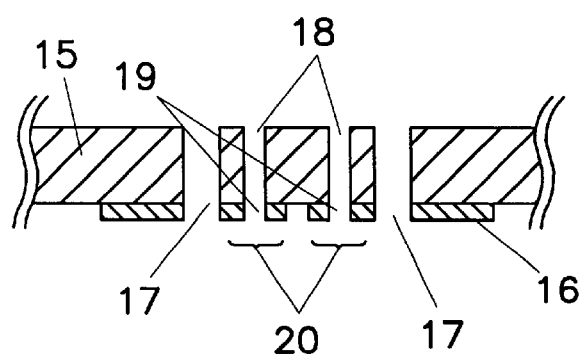
Figure 5A:
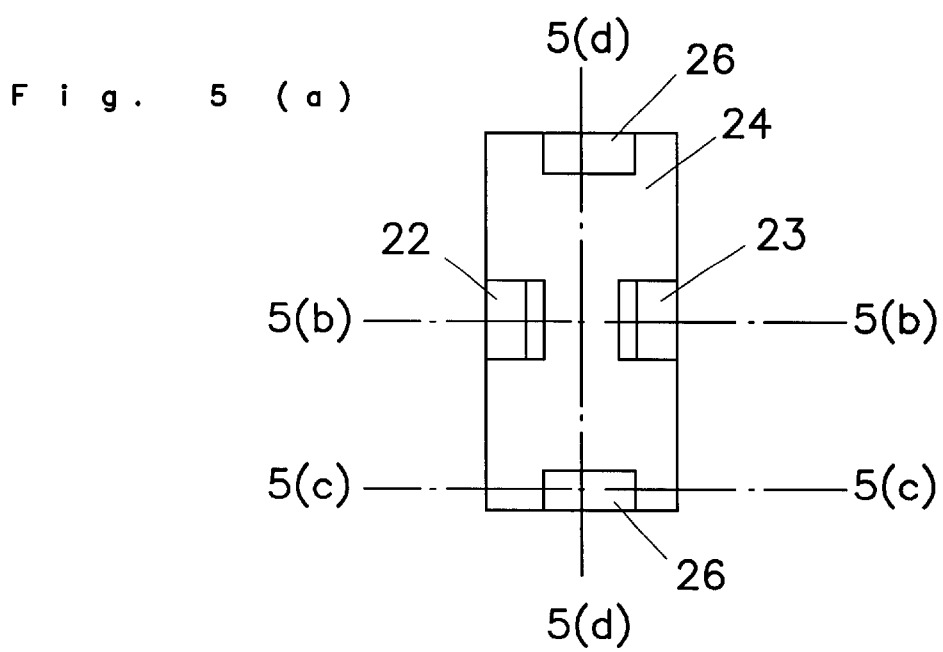
FIG. 5(*a*) is a top view of a part holder in an embodiment of the invention.
Figures 5B, 5C:
Figure 5D:
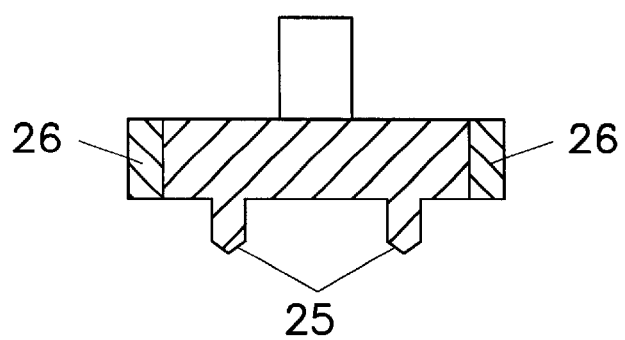

FIG. 4(a) and FIG. 4(b) are drawings showing the substrate for mounting a part holding in an embodiment of the invention. A copper plate 16 which is a conductor plate is provided on one side of an insulating plate 15, and a specified electric circuit is formed in the copper plate 16. The first insertion hole 18 penetrates through the insulating plate 15, and a lead wire 13 provided in a part 11 is inserted. The second insertion hole 19 penetrates through the copper plate 16, in which the lead wire 13 is inserted. A fitting hole 17 which is a part to be supported fits a support 14 of the part holder into the fitting hole 17 from the other side of the substrate 15, so that the part holder is fixed and supported on the substrate 15. When the support 14 is fitted into the fitting hole 17, the lead wire 13 penetrates through the first insertion hole 18 and second insertion hole 19. In the electric circuit composed of the copper plate 16, there is a connection electrode 20 for soldering the lead wire 13 when mounting the part 11.

In such embodiment, the part 11 can be held by the first holding member 8 and second holding member 9, thereby preventing troubles of dislocation of the part 11 from the substrate when conveying the substrate, or occurrence of faulty contact in the subsequent process of soldering.

It is not necessary to fix the part provisionally by using solvent or by clinching the lead wire 13.

In the embodiment, the first holding member 8 and second holding member 9 are pinching the part 11, but any holding method will do as far as the part 11 can be held.

Also in the embodiment, the part holder is fixed and supported on the substrate 15 by fitting the support 14 into the fitting hole 17 from the other side of the substrate 15, but the part to be supported may not be the fitting hole, and it may be enough when the part holder can be fixed on the substrate 15 by holding the support 14.

At the mounting position of the part 11 having the lead wire 13 which is a conductor as mentioned later, by forming a distance protrusion on the insulating plate 15 for maintaining a specified clearance between the bottom of the part 11 and the insulating plate 15, no adverse is caused on the part 11 due to temperature of fused solder when soldering the lead wire 13 by flow method.

(Embodiment 3)

Figure 6:
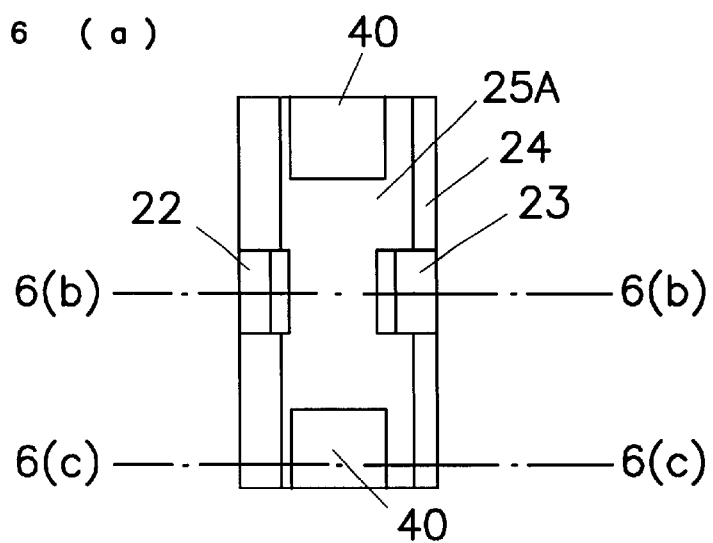
FIG. 6(*a*) is a top view of mounting a chip part on a part holder in an embodiment of the invention.
Figure 6:
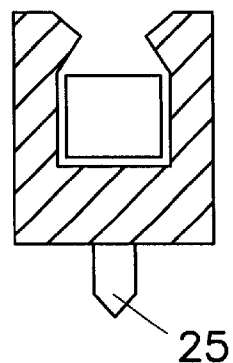
Figure 6:
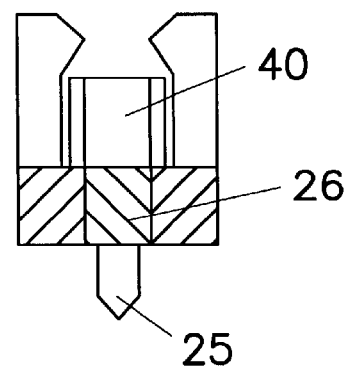

FIG. 5(a), FIG. 5(b), FIG. 5(c), and FIG. 5(d) are drawings showing a part holder in an embodiment of the invention. A first holding member 22 and a second holding member 23 are provided upward of a base 24, and when a part 25A not having lead wire (hereinafter called chip part), such as chip capacitor, is inserted as shown in FIG. 6(a), they are designed to hold the chip part 25A. A support 25 is provided downward of the base 24, and it is intended to support the part holder in an insulating plate 15 on which a copper plate 16 is provided for forming a predetermined electric circuit. An electrode 26 penetrates through the base 24, and, as shown in FIG. 6(a) and FIG. 6(c), when the chip part 25A is held by the first holding member 22 and second holding member 23, an electrode 40 provided in the chip part 25A contacts electrically with the electrode 26.

Figure 7:
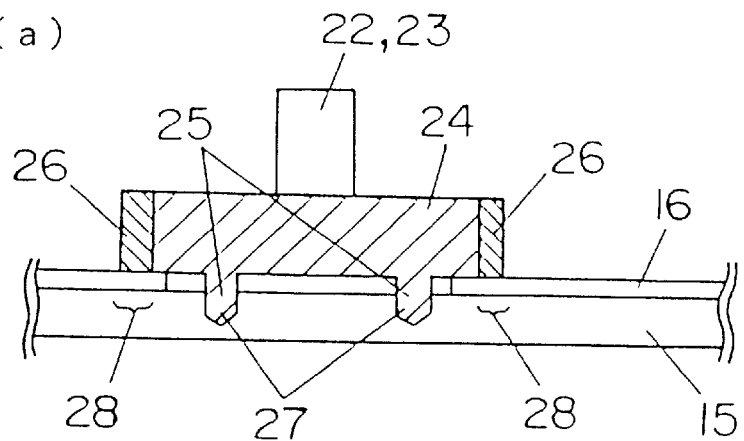
FIG. 7(*a*) is a drawing showing a state of mounting a part holder on a substrate capable of mounting a part holder in an embodiment of the invention.
Figure 7:
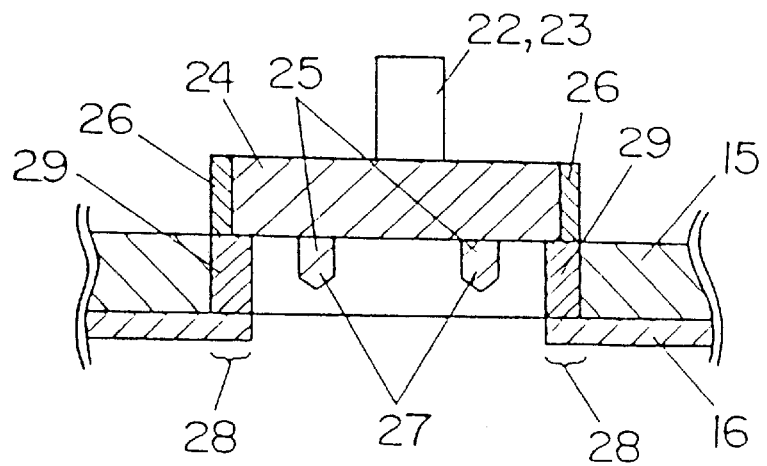

FIG. 7(a) and FIG. 7(b) are drawings showing a substrate capable of mounting a part holder in an embodiment of the invention. A copper plate 16 is provided on one side of an insulating plate 15, and a predetermined electric circuit is formed by this copper plate 16. A part to be supported 27 which is fixed as a support 25 of the part holder is fitted in, and when the support 25 is fixed with the part to be supported 27, an electrode 26 of the part holder electrically contacts with a connection electrode 28 provided on the copper plate 16.

In such embodiment, a chip part 25A can be held by a first holding member 22 and second holding members 23, thereby preventing troubles of dislocation of the chip part 25A from the substrate when conveying the substrate, or occurrence of faulty contact in the subsequent process of soldering. It is not necessary to fix the part provisionally by adhesive.

In the embodiment, the first holding member 22 and second holding member 23 are gripping the chip part 25A, but any holding method will do as far as the chip part 25A can be held.

Figure 8:
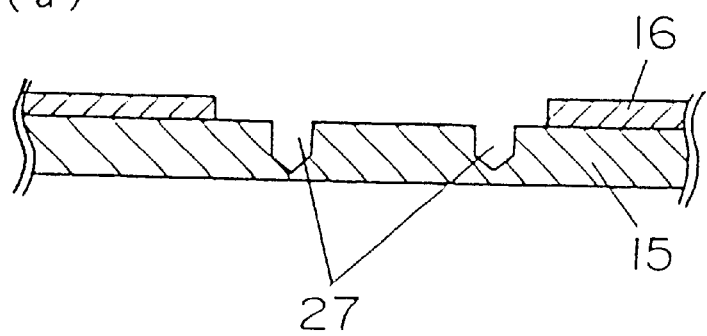
FIG. 8(*a*) is a drawing showing a substrate capable of mounting a part holder in an embodiment of the invention.
Figure 8:
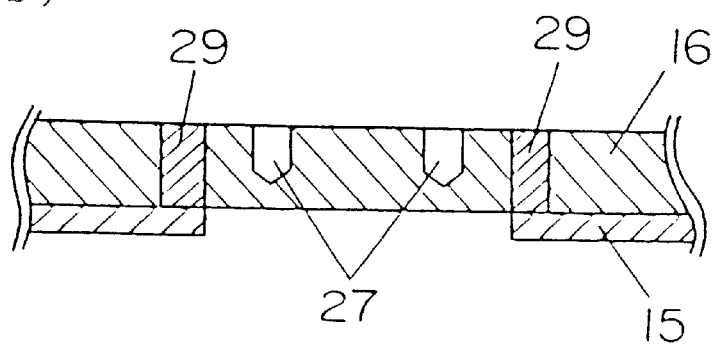

Also, as shown in FIG. 7(a) and FIG. 8(a), from the copper plate 16 side of the substrate, the support 25 may be fixed to the part to be supported 27 provided at the copper plate 16 side, and the electrode 26 of the part holder and the connection electrode 28 of the copper plate 16 may be designed to contact directly electrically, or as shown in FIG. 7(b) and FIG. 8(b), from the insulating plate 15 side, the support 25 may be fixed to the part to be supported 27 provided at the insulating plate 25 side, and the electrode 26 of the part holder and the connection electrode 28 of the copper plate 16 may be designed to contact electrically through a conductor 29 provided in the base 24.

(Embodiment 4)

Figure 9:
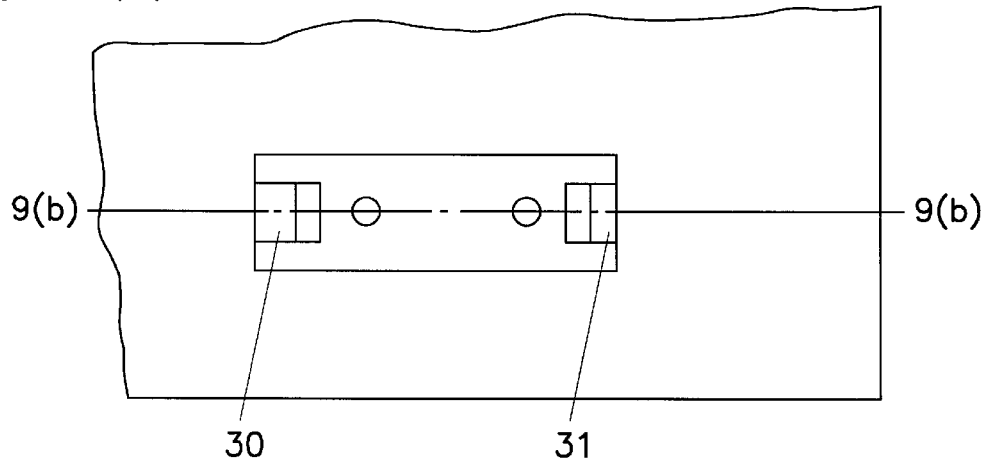
FIG. 9(*a*) is a top view of a substrate having a part holder in an embodiment of the invention.
Figure 9:
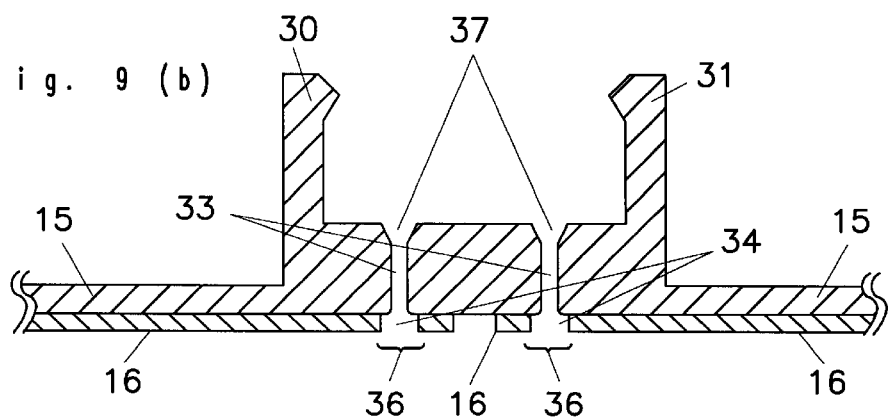
Figure 9:
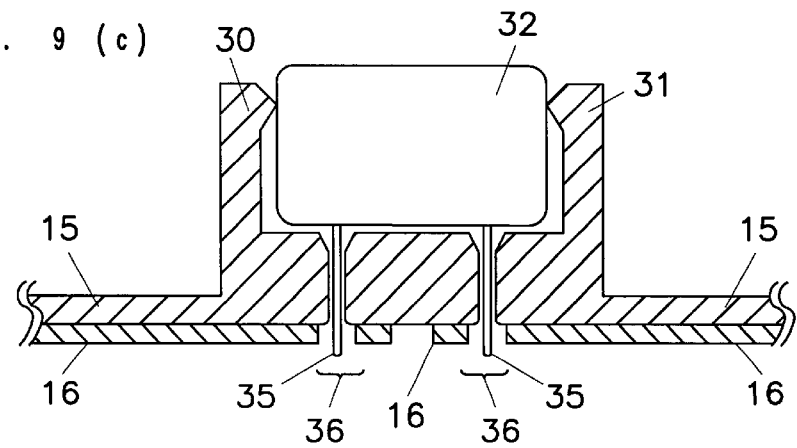

FIG. 9(a), FIG. 9(b), and FIG. 9(c) are drawings showing a substrate having a part holder in an embodiment of the invention. A copper plate 16 which is a conductor plate is provided on one side of an insulating plate 15, and a predetermined electric circuit is formed in this copper plate 16. A first holding member 30 and a second holding member 31 are provided on other side of the insulating plate 15, and, as shown in FIG. 9(c), when a part 32 to be inserted is held by the elasticity of the resin of the insulating plate. A first insertion hole 33 penetrates through the insulating plate 15, and when the part 32 is held between the first holding member 30 and second holding member 31, a lead wire 35 which is a conductor provided in the part 32 is inserted into the first insertion hole 33. A second insertion hole 34 penetrates through the copper plate 16, and when the part 32 is held between the first holding member 30 and second holding member 31, the lead wire 35 provided in the part 32 is inserted into the second insertion hole 34. In an electric circuit formed by the copper plate 16, a connection electrode 36 is provided so as to solder the lead wire 35 when the part 32 is mounted. Above the first insertion hole 33, a lead guide 37 is provided. This lead guide 37 is formed in a slope so as to guide the lead wire 35 into the first insertion hole 33 so that the lead wire 35 may be guided and inserted easily into the first insertion hole 33, and more specifically it is in a conical shape with its peak directed to the lower side, and its central axis is coaxial with the central axis of the first insertion hole 33 and is provided at the side for mounting the part 32.

Herein, the diameter of the first insertion hole 33 is such that the solder may not come out to the upper side (part side) through the first insertion hole 33 when soldering by flow method in subsequent process. In the embodiment, the lead wire 35 is 0.6 mm in diameter, and the first insertion hole 33 is 1.0 mm in diameter, and the clearance (the gap between the first insertion hole 33 and lead wire 35) is 0.2 mm.

In such embodiment, the part 32 can be held by the first holding member 30 and second holding member 31, thereby preventing troubles of dislocation of the part 32 from the substrate when conveying the substrate, or occurrence of faulty contact in the subsequent process of soldering.

It is not necessary to fix the part provisionally by adhesive or by clinching the lead wire 35.

In the embodiment, the first holding member 30 and second holding member 31 are gripping the part 32, but any holding method will do as far as the part 32 can be held.

(Embodiment 5)

Figure 10:
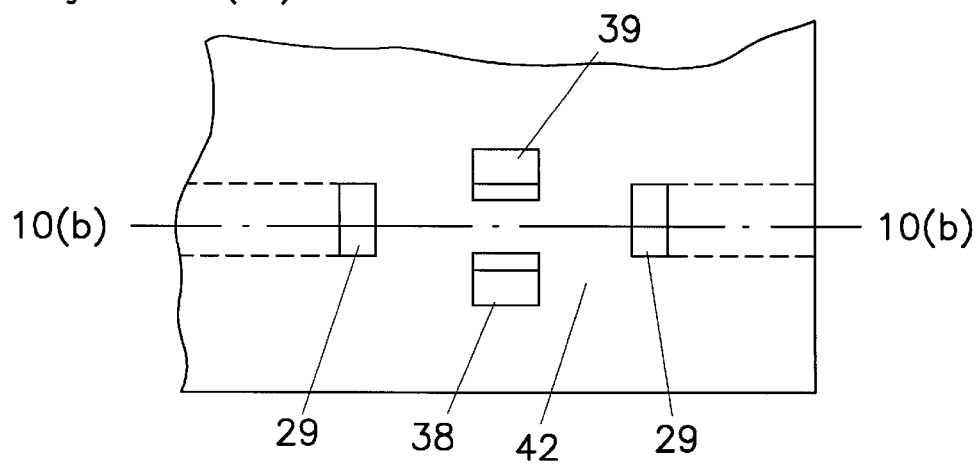
FIG. 10(*a*) is a top view of a substrate having a part holder in an embodiment of the invention.
Figure 10:
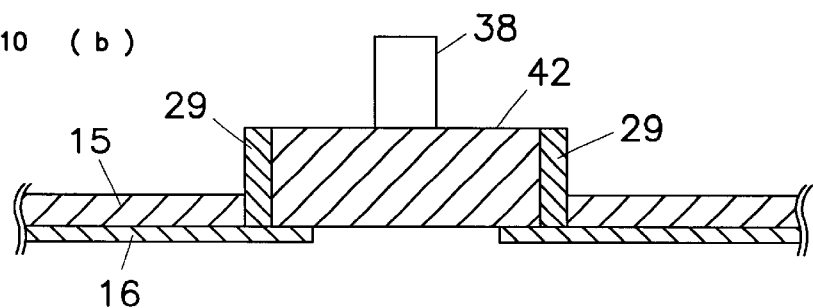
Figure 10:
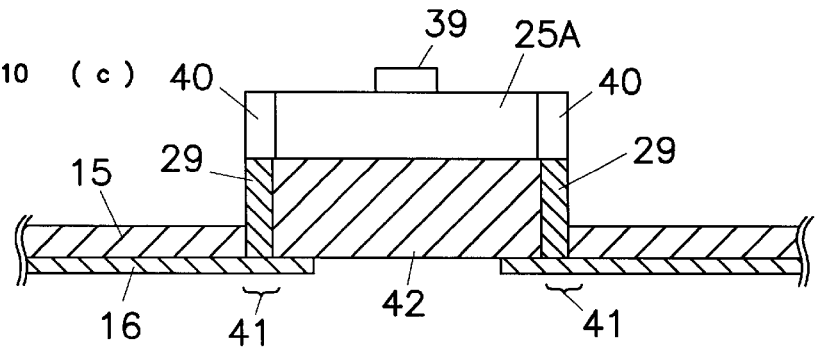
Figure 10:
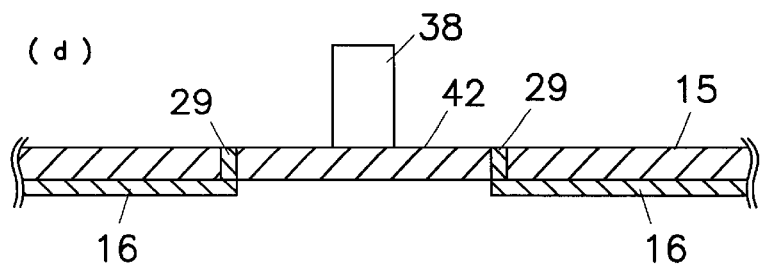

FIG. 10(a) is a drawing showing a substrate having a part holder in an embodiment of the invention. A copper plate 16 which is a conductor plate is provided on one side of an insulating plate 15, so that a predetermined electric circuit is formed. A mounting portion 42 is provided on the insulating plate 15 in order to mount a chip part. A first holding member 38 and a second holding member 39 are provided on other side of the insulating plate 15, and as shown in FIG. 10(c), when the chip part 25A is mounted on the mounting portion 42, it is designed to hold the chip part 25A. An electrode 41 is connected to a conductor 29 penetrating through the insulating plate 15, and when the chip part 25A is mounted on the mounting portion 42 and is held between the first holding member 38 and second holding member 39, an electrode 40 provided in the chip part 25A contacts electrically with the conductor 29, so that the electrode 40 may electrically contact with the connection electrode 41 provided in part of the copper plate 16.

In such embodiment, by holding the chip part 25A between the first holding member 38 and second holding member 39, the chip part 25A can be held on the substrate, thereby preventing troubles of dislocation of the chip part 25A from the substrate when conveying the substrate, or occurrence of faulty contact in the subsequent process of soldering. It is not necessary to fix the part provisionally by adhesive.

In the embodiment, the first holding member 38 and second holding member 39 are gripping the chip part 25A, but any holding method will do as far as the chip part 25A can be held.

Also, the mounting portion 42 may be, as shown in FIG. 10(b), formed of an insulating material building up from the insulating plate 15, or as shown in FIG. 10(d), it may be directly provided on the insulating plate 15.

(Embodiment 6)

Figure 11:
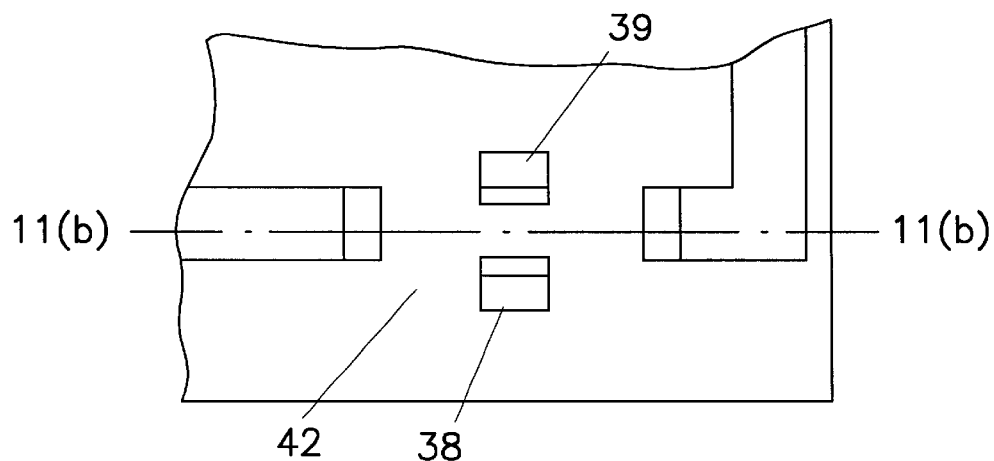
FIG. 11(*a*) is a top view of a substrate having a part holder in an embodiment of the invention.
Figure 11:
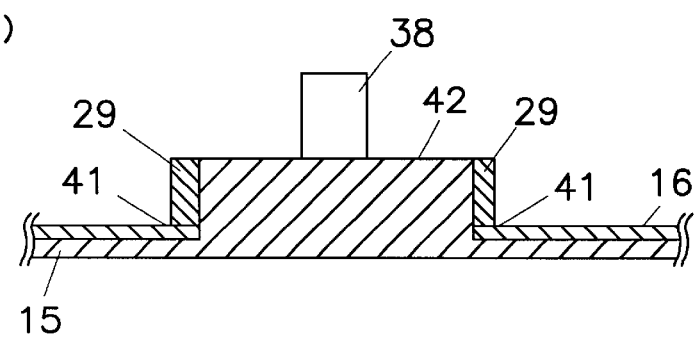
Figure 11:
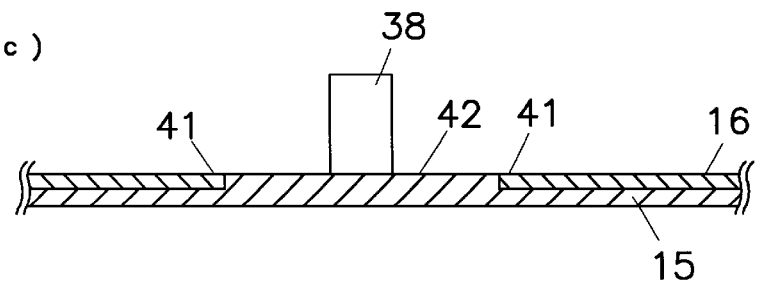
Figure 11:
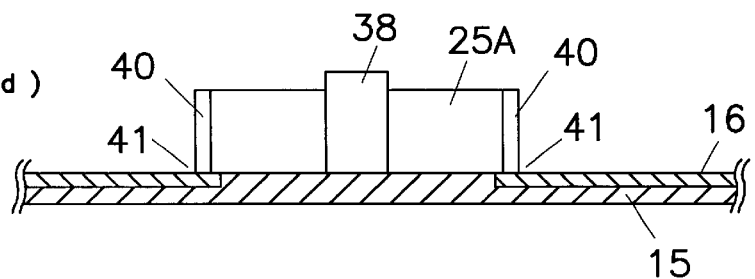

FIG. 11(a) is a drawing showing a substrate having a part holder in an embodiment of the invention. A copper plate 16 which is a conductor plate is provided on one side of an insulating plate 15, so that a predetermined electric circuit is formed. A mounting portion 42 is provided on one side (conductor plate side) of the insulating plate 15 in order to mount a chip part. A first holding member 38 and a second holding member 39 are provided on one side (conductor plate side) of the insulating plate 15, and as shown in FIG. 11(d), when the chip part 25A is mounted on the mounting portion 42, it is designed to hold the chip part 25A. When the chip part 25A is mounted on the mounting portion 42 and is held between the first holding member 38 and second holding member 39, an electrode 40 provided in the chip part 25A contacts electrically with a connection electrode 41 provided in part of the copper plate 16.

In such embodiment, by holding the chip part 25A between the first holding member 38 and second holding member 39, the chip part 25A can be held on the substrate, thereby preventing troubles of dislocation of the chip part 25A from the substrate when conveying the substrate, or occurrence of faulty contact in the subsequent process of soldering. It is not necessary to fix the part provisionally by adhesive.

In the embodiment, the first holding member 38 and second holding member 39 are gripping the chip part 25A, but any holding method will do as far as the chip part 25A can be held.

Also, the mounting portion 42 may be, as shown in FIG. 11(b), formed of an insulating material building up from the insulating plate 15, or as shown in FIG. 11(c), it may be directly provided on the insulating plate 15.

(Embodiment 7)

Figure 12:
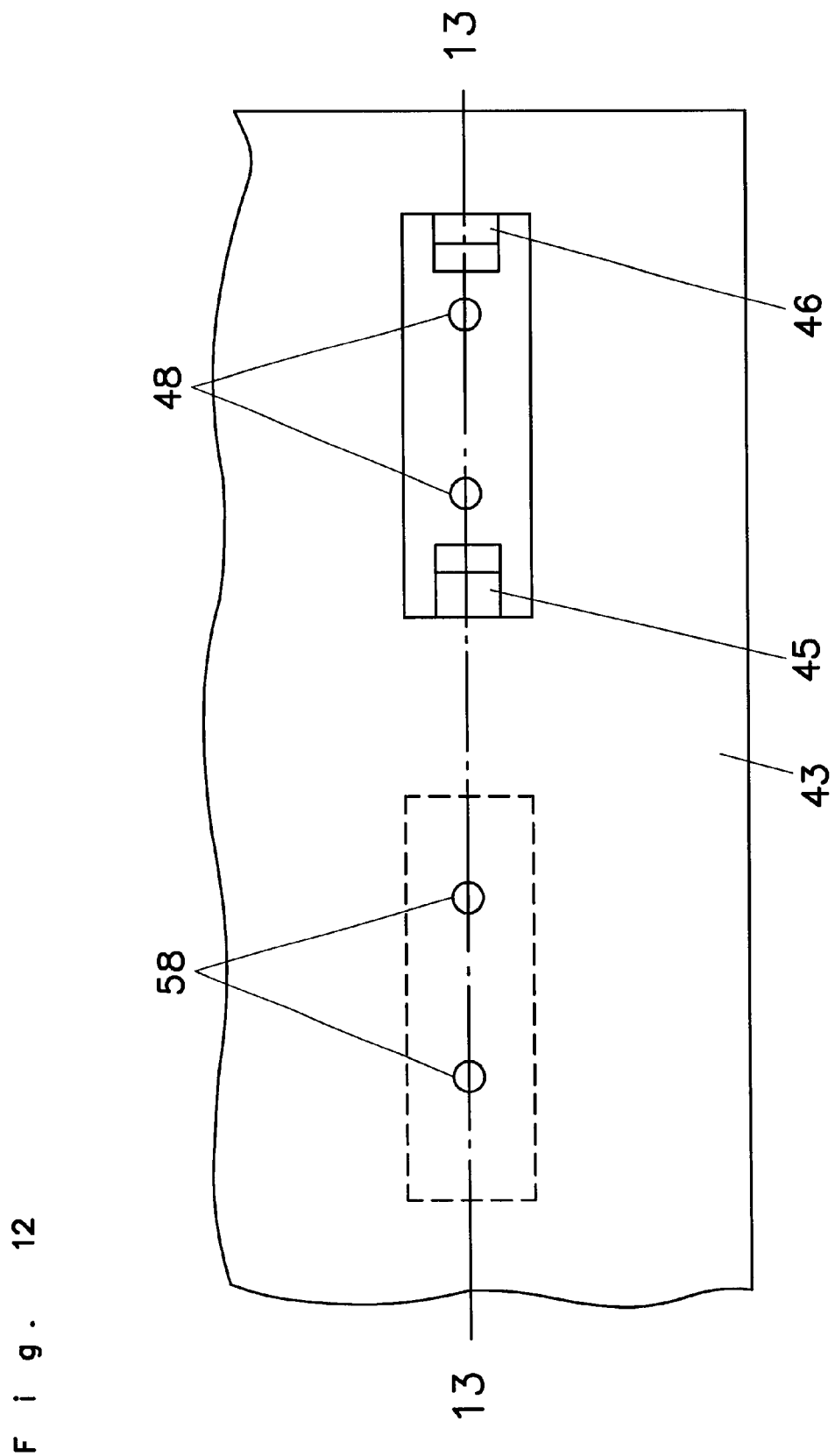
FIG. 12 is a top view of a substrate having a part holder in an embodiment of the invention.
Figure 13:
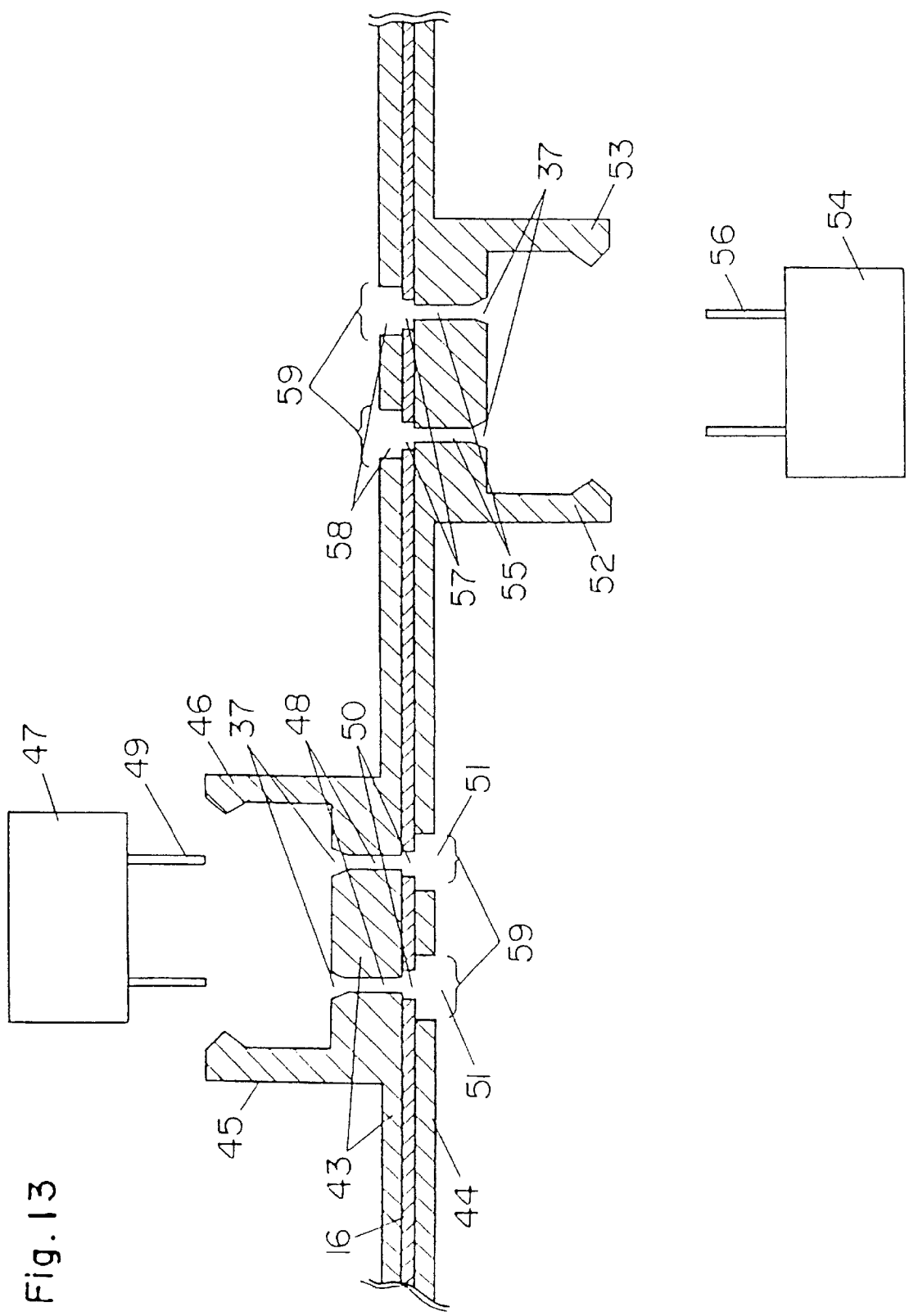
FIG. 13 is a sectional view of 13—13 in FIG. 12.

FIG. 12 and FIG. 13 are drawings showing a substrate having a part holder in an embodiment of the invention. The same structures as in the foregoing embodiments are indicated by the same reference numerals, and description is omitted.

A first insulating plate 43 is provided on one side of a copper plate 16 which is a conductor plate for forming a predetermined electric circuit, and a second insulating plate 44 is provided on other side of the copper plate 16. First holding members 45, 46 are provided on the opposite side of the copper plate 16 across the first insulating plate 43, and grip a first part or a part 47 to be inserted by the elasticity of the resin of the insulating plate. A first insertion hole 48 penetrates through the insulating plate 43, and when the part 47 is held in the first holding members 45, 46, a lead wire 49 which is a conductor provided in the part 47 is inserted into the first insertion hole 48. A second insertion hole 50 penetrates through the copper plate 16, and when the part 47 is held in the first holding members 45, 46, the lead wire 49 is inserted into the second insertion hole 50. A third insertion hole 51 penetrates through the second insulating plate 44, and is intended to insert the lead wire 49 when the part 47 is held in the first holding members 45, 46. Second holding members 52, 53 are provided on the opposite side of the copper plate 16 of the second insulating plate 44, and grip a second part or a part 54 to be inserted by the elasticity of the resin of the insulating plate. A fourth insertion hole 55 penetrates through the second insulating plate 44, and when the part 54 is held in the second holding members 52, 53, a lead wire 56 which is a conductor provided in the part 54 is inserted into the fourth insertion hole 52. A fifth insertion hole 57 penetrates through the copper plate 16, and when the part 54 is held in the second holding members 52, 53, the lead wire 56 is inserted into the fifth insertion hole 57. A sixth insertion hole 58 penetrates through the first insulating plate 43, and is intended to insert the lead wire 56 when the part 54 is held in the second holding members 52, 53. The diameter of the third insertion hole 51 and sixth insertion hole 58 is defined in such a size as to connect in part by soldering to the lead wire 49, lead wire 56, and copper plate 16.

In the electric circuit formed by the copper plate 16, there is a connection electrode 59 for soldering the lead wires 49, 56 when mounting the parts 47, 54, respectively.

This connection electrode 59 is provided by exposing the copper plate on the side opposite to the first holding members 45, 46 and second holding members 52, 53. A lead guide 37 is provided above the first insertion hole 48 and fourth insertion hole 55. The lead guide 37 is formed of a slope for guiding the lead wires 49, 56 into the first insertion hole 48 and fourth insertion hole 55 for the ease of guiding and inserting the lead wires 49, 56 into the first insertion hole 48 and fourth insertion hole 55, and more specifically it is formed in a conical shape having the peak directed to the lower side, and its central axis is coaxial with the central axis of the first insertion hole 48 and fourth insertion hole 55, being provided at the side for mounting the parts 47, 54.

Figure 22:
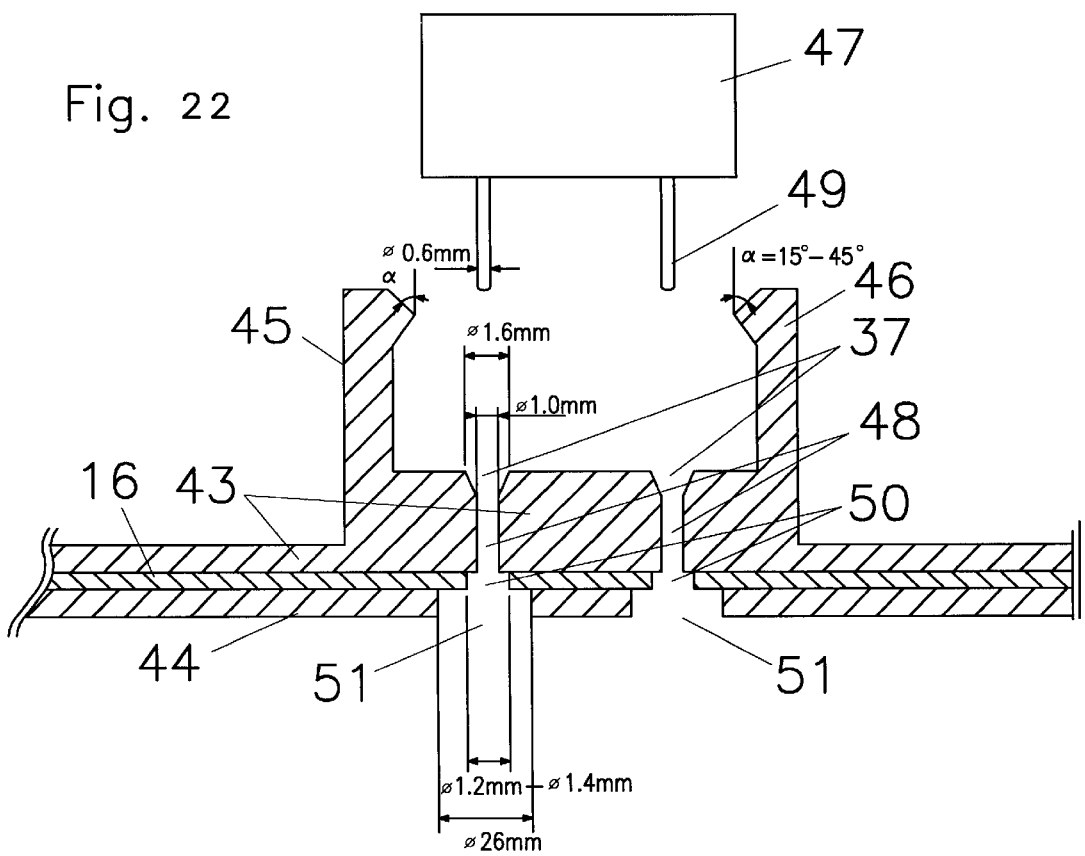
FIG. 22 is a magnified view of a part holder of the invention.

Herein, the diameter of the first insertion hole 48 and fourth insertion hole 55 is defined in such a size that the solder may not come out to the upper side (part side) through the first insertion hole 48 and fourth insertion hole when soldering later by flow method. In this embodiment, the lead wires 49, 56 are 0.6 mm in diameter, the first insertion hole 48 and fourth insertion hole 55 are 1.0 mm in diameter, and the clearance (the gap between the insertion holes 48, 55 and lead wires 49, 56) is 0.2 mm. That is, as shown in FIG. 22, the first insertion hole 48 and fourth insertion hole 55 are 1.0 mm in diameter, the second insertion hole 50 and fifth insertion hole 57 are 1.2 to 1.4 mm in diameter, the third insertion hole 51 and sixth insertion hole 58 are 2.6 mm in diameter, the minimum diameter of the lead guide 37 is 1.0 mm, and the maximum diameter is 1.6 mm, thereby shaping a nearly conical form.

In such embodiment, the parts 47, 54 can be held on both sides of the substrate by the first holding members 45, 46 and second holding members 52, 53, and dislocation of part 47 or part 54 from the substrate when conveying the substrate and occurrence of faulty contact in the subsequent soldering process can be prevented, while mounting on both sides can be realized easily.

Also, it is not necessary to fix the part provisionally by using adhesive or by clinching the lead wires 49, 56.

In the embodiment, the first holding members 45, 46 and second holding members 52, 53 are gripping the parts 47, 54, but any holding method will do as far as the parts 47, 54 can be held.

(Embodiment 8)

Figure 14:
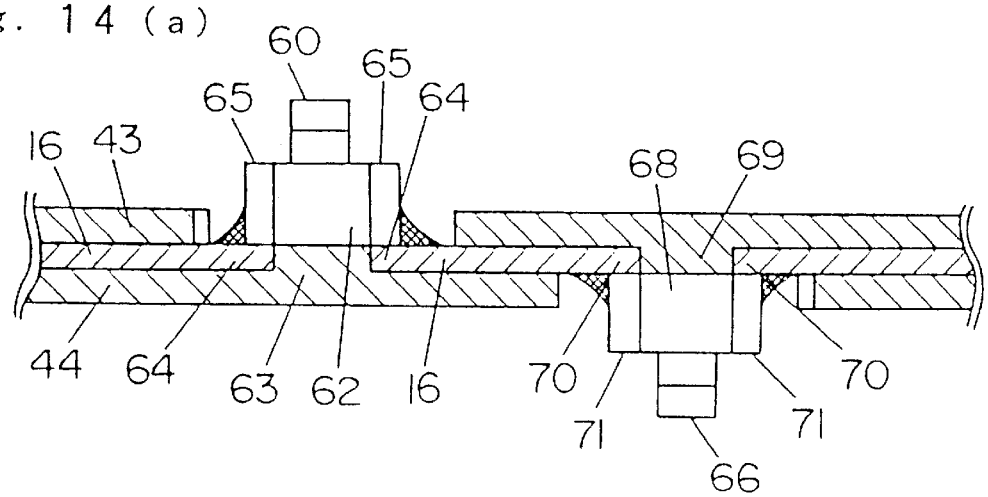
FIG. 14(*a*) and FIG. 14(*b*) are drawings showing the substrate having a part holder in an embodiment of the invention.
Figure 14:
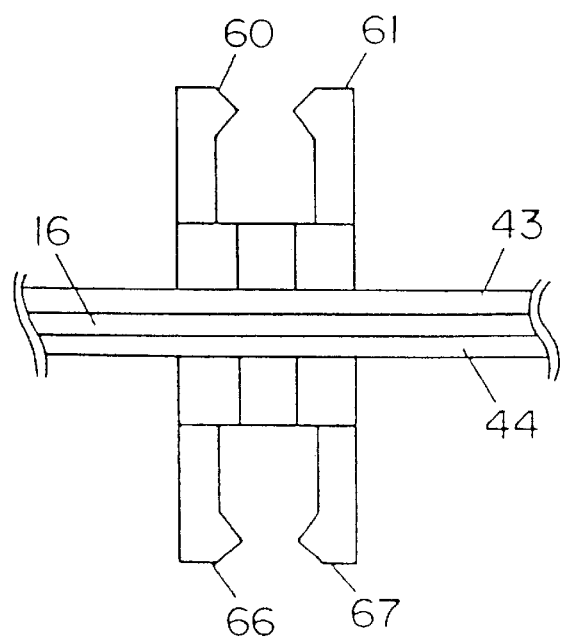

FIG. 14(*a*) and FIG. 14(*b*) are drawings showing a substrate having a part holder in an embodiment of the invention. The same structures as in the foregoing embodiments are indicated by the same reference numerals, and description is omitted.

A first insulating plate 43 is provided on one side of a copper plate 16 which is a conductor plate for forming a predetermined electric circuit, and a second insulating plate 44 is provided on other side of the copper plate 16. First holding members 60, 61 are provided on the opposite side of the copper plate 16 across the first insulating plate 43, and grip a first part or a chip part 62 when the chip part 62 is mounted. A first mounting portion 63 is provided at the copper plate 16 side of the second insulating plate 44, and is to mount the chip part 62. A first connection electrode 64 is provided in the copper plate 16, and when the chip part 62 is mounted on the first mounting portion 63, an electrode 65 provided in the chip part 62 contacts electrically with the first connection electrode 64.

Second holding members 66, 67 are provided on the opposite side of the copper plate 16 across the second insulating plate 44, and grip a second part or a chip part 68 when the chip part 68 is mounted. A second mounting portion 69 is provided at the copper plate 16 side of the first insulating plate 43, and is to mount the chip part 68. A second connection electrode 70 is provided in the copper plate 16, and when the chip part 68 is mounted on the second mounting portion 69, an electrode 71 provided in the chip part 68 contacts electrically with the second connection electrode 70. When the chip part 62 is mounted on the first mounting portion 63, the first holding members 60, 61 grip the chip part 62, and when the chip part 68 is mounted on the second mounting portion 69, the second holding members 66, 67 grip the chip part 68.

In such embodiment, the parts can be held on both sides of the substrate by gripping the chip parts 62, 68 with the first holding members 60, 61 and second holding members 66, 67, and dislocation of chip parts 62, 68 from the substrate when conveying the substrate and occurrence of faulty contact in the subsequent soldering process can be prevented, while mounting on both sides can be realized easily. Also, it is not necessary to fix the parts provisionally by adhesive.

In the embodiment, the first holding members 60, 61 and second holding members 66, 67 are gripping the chip parts 62, 68, but any holding method will do as far as the chip parts 62, 68 can be held.

(Embodiment 9)

Figure 15:
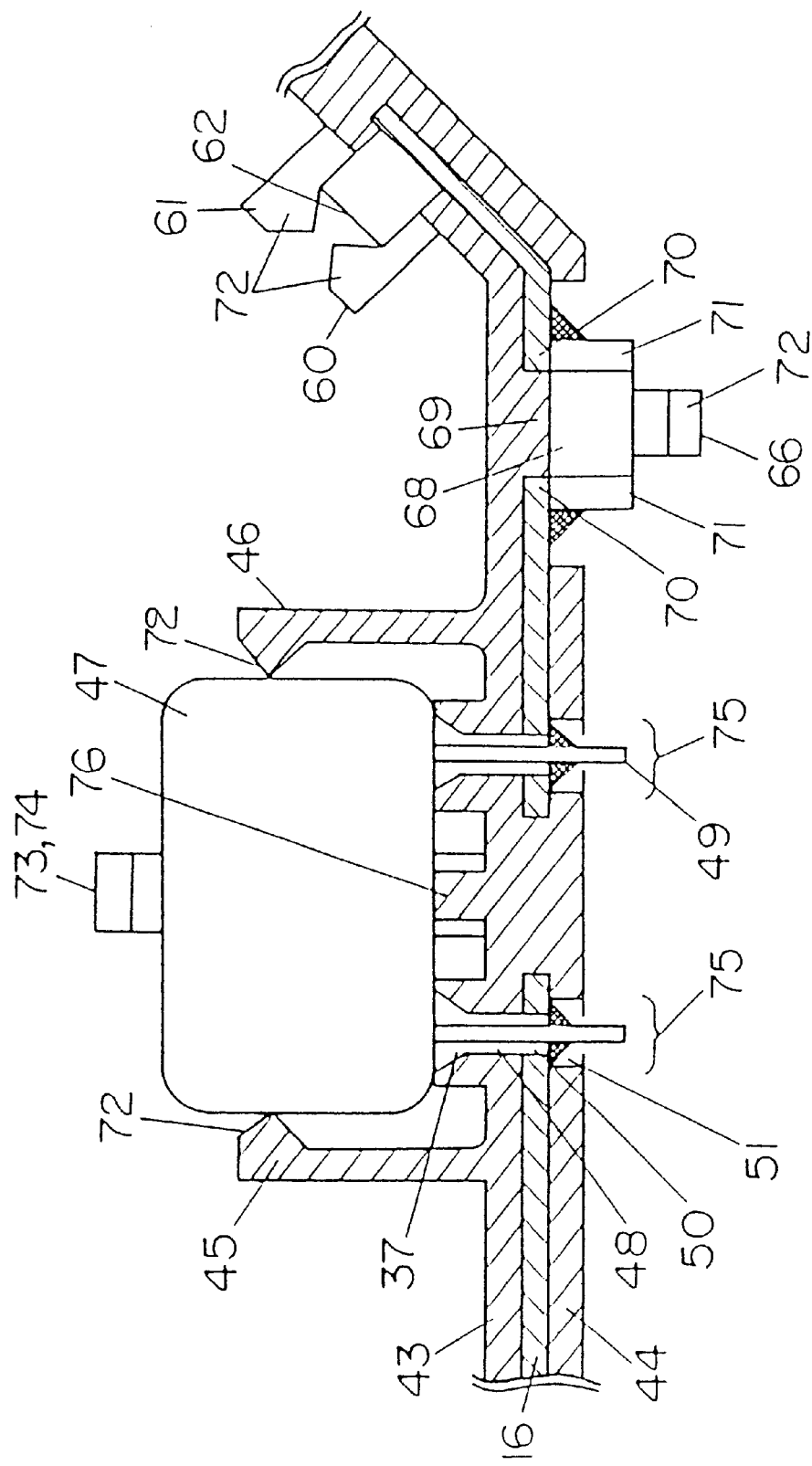
FIG. 15 is a drawing showing a substrate having a part holder in an embodiment of the invention.
Figure 16:
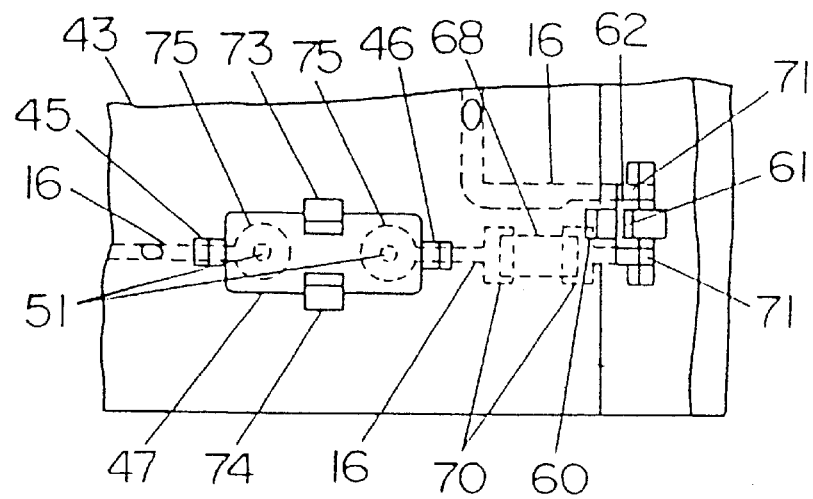
FIG. 16 is a top view of a substrate having a part holder in an embodiment of the invention.
Figure 17:
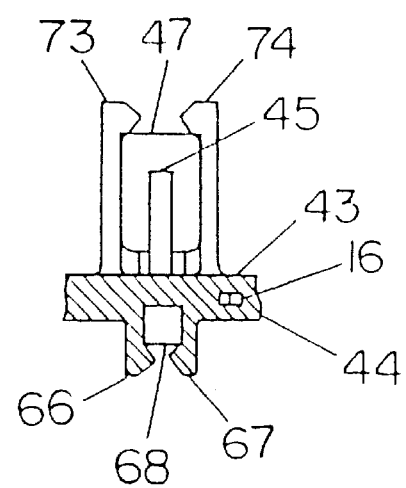
FIG. 17 is a side view of a substrate having a part holder in an embodiment of the invention.

FIG. 15, FIG. 16, and FIG. 17 are drawings showing a substrate having a part holder in an embodiment of the invention. The same structures as in the foregoing embodiments are indicated by the same reference numerals, and description is omitted.

First holding members 45, 46 have a holding pawl 72 inside of the leading end, and the side of a part 47 having a lead wire 49 is held by this holding pawl 72. Third holding members 73, 74 have a holding pawl 72 at the leading end, and the part 47 is held by pressing from above by the holding pawl 72. Of course, the purpose is achieved by either the first holding members 45, 46 or the third holding members 73, 74, and either pair suited to the shape of the part 47 may be selected. The upper portions of the first holding members 45, 46 and third holding members 73, 74 are tapered for accepting the part 47 so that the first holding members 45, 46 and third holding members 73, 74 may be pushed by the part 47 to expand to outside when mounting the part 47. This taper is an angle α of 15 to 45 degrees to the perpendicular as shown in FIG. 22, and by increasing this angle α, when the part 47 is inserted, the force applied in the vertical direction (the part 47 inserting direction) of the first holding members 45, 46 and third holding members 73, 74 is increased, so that the first holding members 45, 46 and third holding members 73, 74 are likely to buckle.

These holding members 45, 46, 73, 74 hold the part 47, and also have a function for positioning the mounting position. The lead wire 49 of the positioned part 47 is positioned so as to penetrate through a second insertion hole 50 of an electric circuit formed by the copper plate 16, and a connection electrode 59 is provided in the copper plate 16 so that the lead wire 49 and copper plate 16 may be connected electrically in subsequent soldering process.

For the ease of insertion of lead wire 49 into the second insertion hole 50, the first insertion hole 48 provided in the first insulating plate 43 has a lead guide 37 formed in a slope for guiding the lead wire 49 into the second insertion hole 50. The lead guide 37 is a conical form having its peak directed toward the second insertion hole 50, and is provided coaxially with the central axis of the second insertion hole 50. Of course, not limited to the conical form, the lead guide 37 may have a slope for guiding the lead wire 49 into the second insertion hole 50. Moreover, at the projecting side of the lead wire 49 penetrating through the second insertion hole 50, an opening 75 is provided for soldering to the second insulating plate 44. Further, at the part 47 mounting side, a distance protrusion 76 is provided, and a specified space is maintained between the bottom of the part 47 and the first insulating plate 43. By keeping this space, when soldering the lead 49 by flow method, adverse effect is not caused on the part 47 by the temperature of the fused solder. In this embodiment, by projecting the lead guide 37 from the first insulating plate 43 as shown in FIG. 15, the distance protrusion 76 and the lead guide 37 may be commonly used. That is, at the mounting position of the part 47 having the lead wire 49 as conductor, it is designed to maintain a specified space between the bottom of the part 47 and the first insulating plate 43 on the first insulating plate 43.

Around the mounting position of the chip parts 62, 68, holding members 60, 61, 66, 67 are provided. In this embodiment, two chip parts 62, 68 to be mounted are shown, and one is mounted on the back side of the part 47, and the other at the upper side of a plane bent by 45 degrees. That is, in this embodiment, the electronic parts to be mounted can be mounted on either face or back side, and the shape of the insulating plates 43, 44 can be composed by matching with the shape of the place of installation. The holding members 60, 61, 66, 67 have the holding pawl 72 provided at the leading end, and the chip parts 62, 68 are held by pressing from above by the holding pawl 72. These holding members 60, 61, 66, 67 have the functions for both holding and positioning the chip parts 62, 68, and at the coming positions of the electrodes 65, 71 of the positioned chip parts 62, 68, the connection electrodes 64, 70 provided in the copper plate 16 for composing the predetermined electric circuit are provided. The upper part of the holding pawl 72 is tapered for accepting the chip parts 62, 68 so that the holding members 60, 61, 66, 67 may be pushed and extended by the chip parts 62, 68 when mounting the chip parts 62, 68.

(Embodiment 10)

Figure 18:
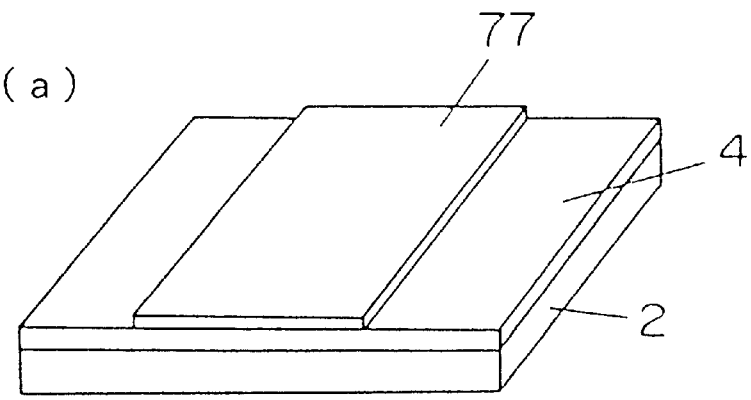
FIG. 18(a), FIG. 18(b), and FIG. 18(c) are drawings showing a method of manufacturing a substrate having a part holder in an embodiment of the invention.
Figure 18:
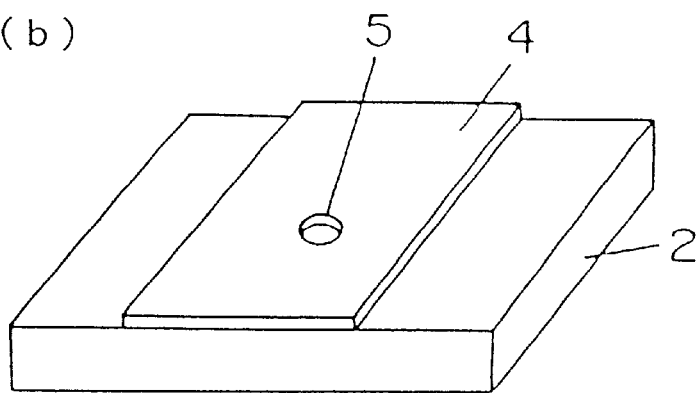
Figure 18:
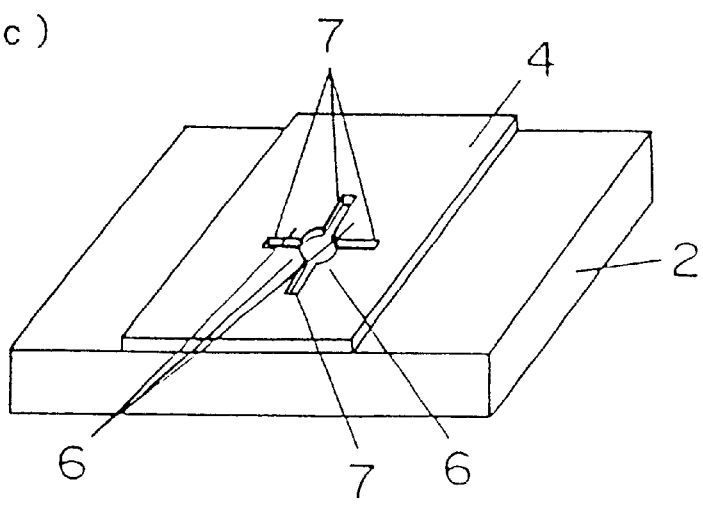
Figure 20:
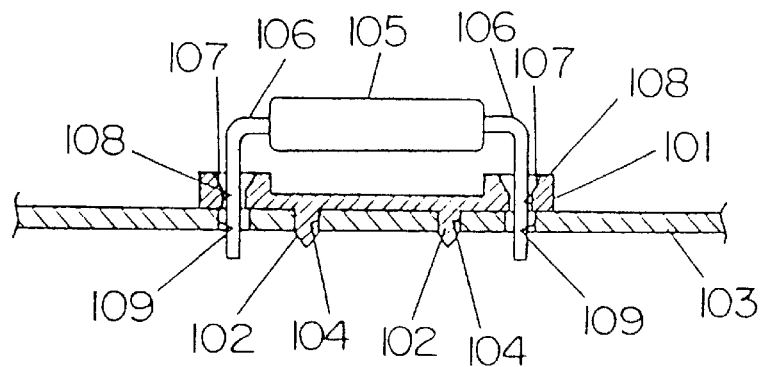
FIG. 20 is a sectional view having a conventional part insertion tool provided on a substrate.
Figure 21:
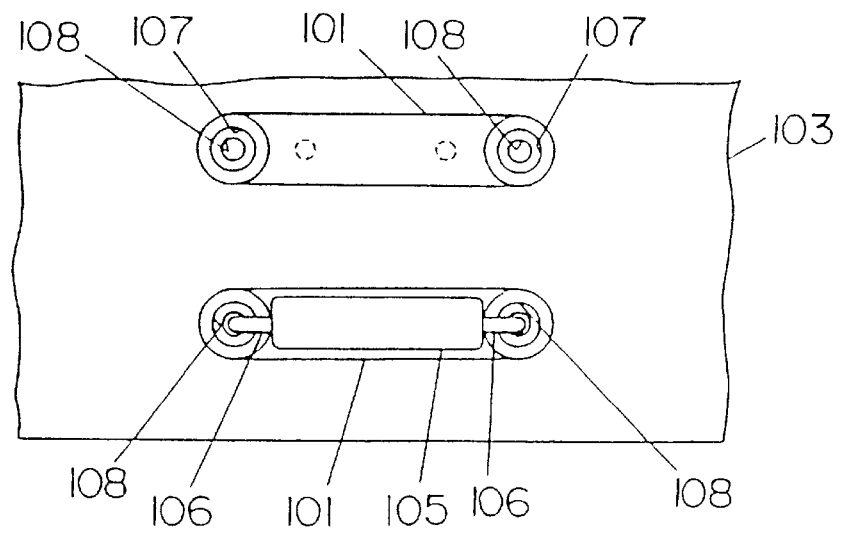
FIG. 21 is a top view of having a conventional part insertion tool provided on a substrate.

FIG. 18(a), FIG. 18(b) and FIG. 18(c) are drawings showing a method of manufacturing a substrate having a part holder in an embodiment of the invention.

First, as shown in FIG. 18(a), a copper plate 4 which is a conductor plate formed on a substrate 2 as an insulating plate is masked in a specified shape for composing an electric circuit by resist 77 of an organic solvent.

Consequently, the substrate 2 prepared in FIG. 18(a) is immersed in an etching solution for a specified time, and the copper plate 4 is etched. As a result, the predetermined electric circuit before mounting of the part is formed by the copper plate 4 on the substrate 2.

Next, in order to pass a lead wire 3 which is a conductor into the substrate 2, a first insertion hole 1 of which diameter is more than the width of the lead wire 3 is drilled from the substrate 2 side.

Then, as shown in FIG. 18(b), in order to pass the lead wire 3 into the copper plate 4, a second insertion hole 5 of which diameter is less than the width of the lead wire drilled from the copper plate 4 side.

Finally, as shown in FIG. 18(c), a notch 7 is provided by cutting out the hole peripheral area of the copper plate 4 by a cross-shaped punch in a radial form from the center of the second insertion hole 5 of the copper plate 4.

Incidentally, when masking by the resist 77, the notch 7 and the second insertion hole 5 may be masked at the same time so as to etch the copper plate 4, and therefore in the etching process, the copper plate 4 may be formed in a specified shape, and the second insertion hole 5 and notch 7 can be formed simultaneously.

In this method, the substrate having the part holder of the invention can be manufactured.

(Embodiment 11)

FIG. 19(a), FIG. 19(b), and FIG. 19(c) are process diagrams showing a method of manufacturing a substrate having a part holder in an embodiment of the invention.

First, as shown in FIG. 19(a), a copper plate 4 which is a conductor plate is formed into a specified shape so as to form a predetermined electric circuit. At this time, it may be formed into a specified shape by pressing or into a specified shape by etching. Then, at least one side of the copper plate 4 is covered by an insulating material. More specifically, as shown in FIG. 19(b), a copper plate is inserted into a die 78, and formed by injection molding or the like. In the embodiment, by inserting the copper plate into the die 78, a resin 80 which is an insulating material is injected into the die from a resin injection port 79, and the resin 80 is solidified. At this time, in order that the resin 80 may cover the copper plate in a coating thickness of 0.5 to 1 mm, holding members 8, 9 are provided thereon around the mounting position of a part 11 having a lead wire 13 which is a conductor. When holding the part 11 by the holding members 8, 9, the lead wire 13 of the part 11 or an electrode 26 of a chip part 25A is designed to contact electrically with part of the copper plate 4. That is, in order to solder later, a specified position of the copper plate 4 is exposed, and the copper plate 4 and resin 80 are formed.

Finally, as shown in FIG. 19(c), extra resin getting into the copper plate 4 is pressed and removed by a press 81.

In such method, the substrate having the part holder of the invention can be manufactured, and it may be manufactured easily by integral molding.

In the substrate described in the invention, a copper plate is used as the conductor plate, and its thickness is 0.1 mm to 2 mm, but the thickness of the copper plate can be set arbitrarily depending on the current capacity of the circuit provided in the substrate, and a thin copper plate may be used in a circuit of small current capacity, while a thick copper plate may be used in a circuit of large current capacity.

Therefore, a very small current circuit and a circuit of an electric appliance of several kilowatts can be combined together. As the conductor or conductor plate, a copper plate is used, but the material may be other conductive material such as aluminum, gold and silver, as far as a specified current capacity is obtained.

As the insulating plate and insulating material, polyphenylene sulfide resin (PPS), liquid crystal polymer (LCP), polybutylene terephthalate (PBT), and other insulating synthetic resin excellent in insulating characteristic and heat resistant characteristic are used, and the thickness is 0.5 to 1 mm.

The size of the substrate described in the invention can be formed from several mm×several mm to hundreds of mm×hundreds of mm, and when the thickness of the insulating plate is 0.4 mm or more, it conforms to the requirement of the Electrical Appliance and Material Control Law.

Soldering relating to the substrate of the invention is to apply solder (cream solder) preliminarily to the connection electrode and electrode of the copper plate for forming the electric circuit of the substrate, and solder by reflow method (melting the solder by hot air or heater and soldering).

In the case of a part having a lead wire mounted on the top surface, it is also possible to solder by the reflow method by using fused solder bath in which fused solder is injected.

By increasing the thickness of the copper plate, it is possible to include a circuit of a large current capacity, and therefore by using the present invention, a circuit of a charger of a mobile telephone, a motor circuit of inverter air conditioner of about up to 2 kW, and various DC/AC converter circuits can be manufactured.

Industrial Applicabilty

According to a part holder and a substrate having a part holder of the invention, by the holder provided around the mounting position of the parts on the insulating plate, the parts are held by making use of the elasticity of the resin, and therefore it does not require the step of fixing provisionally the part by using adhesive or by clinching the lead wire, or the step of mounting the insertion guide as the case may be.

Besides, since only the thickness of the copper plate for composing the electric circuit can be set large, an electric circuit of a large current capacity can be formed into a circuit board.

Moreover, by disposing a lead guide, the lead can be inserted easily, and the insertion guide used in the prior art is not necessary.

By setting a distance protrusion, yet, when soldering by the flow method, the soldering temperature of the fused solder bath does not have any adverse effect on the electronic part with lead.

In the substrate having the part holder, it is not necessary to install an insertion guide separately, and the provisional fixing process of the part by adhesive or clinching of lead is not needed, and it is possible to form into a shape suited to the mounting position of the circuit board.

What is claimed is:

1. A part holder for holding a part on a substrate having an electrical circuit thereon, the part holder comprising a holding member, a base and a support, the holding member extending upward of the base for holding the part, the support extending downward of the base for supporting the part holder on a substrate having an electric circuit thereon and an electrode unit penetrating through the base so that an electrode on the part is capable of contacting the electric circuit on the substrate.

2. A part holder of claim 1, wherein a distance protrusion for keeping a specified clearance between the bottom of the part having the conductor and the insulating plate is provided on the insulation plate, at the mounting position of the part having the conductor.

3. A part holder of claim 1, wherein a lead guide portion having a slope for guiding and inserting the lead wire provided in the part into the insertion hole is provided at the part mounting side of the insertion hole and coaxially with the insertion hole.

4. A substrate comprising a conductor plate, an insulating plate with the conducting plate provided on one side of the insulating plate, the conductor plate being an electric circuit, a holding member provided on an opposite side of the insulating plate for holding a part to be inserted therein, and a first insertion hole penetrating through the insulating plate for inserting a lead wire of the part when the part is held in the holding member, and a second insertion hole penetrating through the conductor plate for inserting there through the lead wire when the part is held by the holding member.

5. A substrate of claim 4, wherein a distance protrusion for keeping a specified clearance between the bottom of the part and the insulating plate is provided on the insulating plate, at the mounting position of the part.

6. A substrate of claim 4, wherein a lead guide portion having a slope for guiding and inserting the conductor provided in the part into the insertion hole is provided at the part mounting side of the insertion hole and coaxially with the insertion hole.

7. A substrate comprising a conductor plate, an insulating plate with the conductor plate on one side of the insulating plate, the conductor plate being an electric circuit, and a holding member for holding a part is provided an opposite side of the insulating plate, the holding member having an electrode unit so that an electrode of the part electrically contacts with the electrode unit when the part is held in the holding member.

8. A substrate comprising a conductor plate, an insulating plate with the conductor plate on one side of the insulating plate, the conductor plate being an electric circuit, a holding member provided on the one side of the insulating plate for holding a part, the holding member having an electrode unit, and a mounting portion provided on another side of the insulating plate for mounting the part, wherein an electrode of the part electrically contacts with the electrode unit when the part is mounted on the mounting portion and is held in the holding member.

9. A substrate comprising a first insulating plate, a conductor plate with the first insulating plate on one side of the conductor plate, the conductor plate being an electric circuit, a second insulating plate provided on another side of the conductor plate, a holding member provided on an opposite side of the conductor plate from the first insulating plate for holding a part, a first insertion hole penetrating through the first insulating plate for inserting a lead wire of the part when the part is held in the holding member, a second insertion hole penetrating through the conductor plate for inserting the lead wire of the part when the part is held in the holding member, and a third insertion hole penetrating through the second insulating plate for inserting the lead wire of the part when the part is held in the holding member, wherein the diameter of the third insertion hole is large enough to connect by soldering the lead wire of the part and a portion of the conductor plate.

10. A substrate of claim 9, wherein a distance protrusion for keeping a specified clearance between the bottom of the part and the insulating plate is provided on the insulating plate, at the mounting position of the part.

11. A substrate of claim 9, wherein a lead guide portion having a slope for guiding and inserting the conductor provided in the part into the insertion hole is provided at the part mounting side of the insertion hole and coaxially with the insertion hole.

12. A substrate comprising a first insulating plate, a conductor plate with the first insulating plate on one side of the conductor plate, the conductor plate being an electric circuit, a second insulating plate provided on another side of the conductor plate, a holding member provided on an opposite side of the conductor plate from the first insulating plate for holding a part, a mounting portion for mounting the part at the conductor plate side of the second insulating plate, and an electrode unit provided on the conductor plate so that an electrode of the part electrically contacts the electric circuit when the part is mounted on the mounting portion, wherein the holding member holds the part when the part is mounted on the mounting portion.

13. A substrate comprising a first insulating plate, a conductor plate with the first insulating plate on one side of the conductor plate, the conductor plate being an electric circuit, a second insulating plate provided on another side of the conductor plate, a first holding member provided on the opposite side of the conductor plate of the first insulating plate for holding a first part to be inserted, a first insertion hole penetrating through the first insulating plate for inserting a lead wire provided in the first part when holding the first part in the first holding member, a second insertion hole penetrating through the conductor plate for inserting the lead wire provided in the first part when holding the first part in the first holding member, a third insertion hole penetrating through the second insulating plate for inserting the lead wire provided in the first part when holding the first part in the first holding member, a second holding member provided on the opposite side of the conductor plate of the second insulating plate for holding a second part to be inserted, a fourth insertion hole penetrating through the second insulating plate for inserting a lead wire provided in the second part when holding the second part in the second holding member, a fifth insertion hole penetrating through the conductor plate for inserting the lead wire provided in the second part when holding the second part in the second holding member, a sixth insertion hole penetrating through the first insulating plate for inserting the lead wire provided in the second part when holding the second part in the second holding member, wherein the diameter of the third insertion hole and sixth insertion hole is large enough to connect the lead wire of the first part, the lead wire in the second part and a portion of the conductor plate by soldering.

14. A substrate of claim 13, wherein a distance protrusion for keeping a specified clearance between the bottom of the part and the insulating plate is provided on the insulating plate, at the mounting position of the part.

15. A substrate of claim 13, wherein a lead guide portion having a slope for guiding and inserting the conductor provided in the part into the insertion hole is provided at the part mounting side of the insertion hole and coaxially with the insertion hole.

16. A substrate comprising a first insulating plate, a conductor plate with the first insulating plate on one side of the conductor plate, the conductor plate being an electric circuit, a second insulating plate provided on another side of the conductor plate, a first holding member provided on the opposite side of the conductor plate of the first insulating plate for holding a first part, a first mounting portion for mounting the first part at the conductor plate side of the second insulating plate, a first electrode unit provided on the conductor plate so that an electrode provided in the first part electrically contacts when the first part is mounted on the first mounting portion, a second holding member provided on the opposite side of the conductor plate of the second insulating plate for holding a second part, a second mounting portion for mounting the second part at the conductor plate side of the first insulating plate, and a second electrode unit provided on the conductor plate so that an electrode provided in the second part electrically contacts when the second part is mounted on the second mounting portion, wherein the first holding member holds the first part when the first part is mounted on the first mounting portion, and the second holding member holds the second part when the second part is mounted on the second mounting portion.

17. A substrate comprising a first insulating plate, a conductor plate with the first insulating plate on one side of the conductor plate, the conductor plate being an electric circuit, a second insulating plate provided on another side of the conductor plate, a first holding member provided on the opposite side of the conductor plate of the first insulating plate for holding a first part to be inserted, a first insertion hole penetrating through the first insulating plate for inserting a lead wire provided in the first part when holding the first part in the first holding member, a second insertion hole penetrating through the conductor plate for inserting the lead wire provided in the first part when holding the first part in the first holding member, a third insertion hole penetrating through the second insulating plate for inserting the lead wire provided in the first part when holding the first part in the first holding member, a second holding member provided on the opposite side of the conductor plate of the second insulating plate for holding a second part, a mounting portion for mounting the second part at the conductor plate side of the first insulating plate, and an electrode unit provided in the conductor plate so that an electrode provided in the part contacts electrically when the part is mounted on the mounting portion, wherein the second holding member holds the second part when the second part is mounted on the mounting portion, and the diameter of the third insertion hole is large enough to connect the lead wire of the first part and a portion of the conductor plate by soldering.

18. A substrate of claim 17, wherein a distance protrusion for keeping a specified clearance between the bottom of the part and the insulating plate is provided on the insulating plate, at the mounting position of the part.

19. A substrate of claim 17, wherein a lead guide portion having a slope for guiding and inserting the conductor provided in the part into the insertion hole is provided at the part mounting side of the insertion hole and coaxially with the insertion hole.

20. A method of manufacturing a substrate comprising the steps of providing a conductor plate, depositing an insulating material on a side of the conductor plate, and providing a holding member for holding a part on a portion of the insulating material so that the part contacts the conductor plate when the part is held in the holding member.

* * * * *